(12) United States Patent
Baltar

(10) Patent No.: US 6,446,179 B2
(45) Date of Patent: *Sep. 3, 2002

(54) COMPUTING SYSTEM WITH VOLATILE LOCK ARCHITECTURE FOR INDIVIDUAL BLOCK LOCKING ON FLASH MEMORY

(75) Inventor: Robert L. Baltar, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/748,826

(22) Filed: Dec. 26, 2000

Related U.S. Application Data (63) Continuation of application No. 09/076,330, filed on May 11, 1998, now Pat. No. 6,209,069.

(51) Int. Cl.[7] ................. G06F 12/16; G06F 12/06; G11C 16/06
(52) U.S. Cl. ................. 711/163; 711/103; 365/195; 365/185.11
(58) Field of Search ................. 711/103, 163, 711/152, 5, 154; 365/185.11, 185.29, 185.33, 195

(56) References Cited

U.S. PATENT DOCUMENTS

| | | | |
|---|---|---|---|
| 5,065,364 A | 11/1991 | Atwood et al. | 365/185 |
| 5,126,808 A | 6/1992 | Montalvo et al. | 365/185.09 |
| 5,197,034 A | 3/1993 | Fandrich et al. | 365/227 |
| 5,210,845 A | 5/1993 | Crawford et al. | 711/128 |
| 5,293,424 A | 3/1994 | Holtey | 711/152 |
| 5,297,148 A | 3/1994 | Harari et al. | 714/710 |
| 5,369,754 A | 11/1994 | Fandrich et al. | 711/103 |
| 5,438,546 A | 8/1995 | Ishac et al. | 365/200 |
| 5,442,704 A | 8/1995 | Holtey | 711/163 |
| 5,509,134 A | 4/1996 | Fandrich et al. | 711/103 |
| 5,513,136 A | 4/1996 | Fandrich et al. | 365/185.04 |
| 5,592,641 A | 1/1997 | Fandrich et al. | 711/103 |
| 5,673,222 A * | 9/1997 | Fukumoto et al. | 365/185.11 |
| 5,822,251 A | 10/1998 | Bruce et al. | 365/185 |
| 5,886,582 A | 3/1999 | Stansel | 711/152 |
| 5,954,818 A * | 9/1999 | Dalvi et al. | 711/163 |
| 5,974,500 A | 10/1999 | Maletsky et al. | 711/103 |
| 5,991,197 A * | 11/1999 | Ogura et al. | 365/185.11 |
| 6,026,016 A * | 2/2000 | Gafken | 365/185.04 |
| 6,154,819 A * | 11/2000 | Larsen et al. | 711/163 |
| 6,209,069 B1 * | 3/2001 | Baltar | 711/163 |

OTHER PUBLICATIONS

International Search Report in connection with Int'l Application PCT/US99/09462 (8 pages).

"How Cellular Pirates Have Thwarted Efforts To Outsmart Them," by G. Naik, Wall Street Journal, p. B1, Mar. 16, 1995.

"Cellular Carriers Try New Tricks to Beat Bandits," by G. Naik, Wall Street Journal, p. B1, Mar. 16, 1995.

* cited by examiner

*Primary Examiner*—Glenn Gossage
(74) *Attorney, Agent, or Firm*—Blakely Sokoloff Taylor & Zafman LLP (57) ABSTRACT

An apparatus and method for protecting memory blocks in a block-based flash erasable programmable read only memory device are disclosed. A non-volatile memory array includes a number of blocks that are capable of being placed in a locked state or an unlocked state. A volatile lock register is coupled to each of the lockable blocks in the memory array. A logic state is coupled to one input of the volatile lock register, and a block set/reset line is coupled to a second input of the volatile lock register. A block latch control line is coupled to one input of the logic gate, and a group latch control line is coupled to a second input of the logic gate. The method includes reading a first command of a multi-cycle command specifying a lock configuration of one or more memory blocks and reading a second command specifying the number of memory blocks to be lock configured. The method and apparatus allow a user to dynamically select which blocks of a flash array to lock or unlock and minimize the possibility of data corruption during block lock and unlock cycles.

12 Claims, 6 Drawing Sheets

COMPUTING SYSTEM WITH VOLATILE LOCK ARCHITECTURE FOR INDIVIDUAL BLOCK LOCKING ON FLASH MEMORY

This is a continuation of application Ser. No. 09/076,330, filed on May 11, 1998, now U.S. Pat. No. 6,209,069.

CROSS REFERENCE TO RELATED APPLICATIONS

This is a continuation of application Ser. No. 09/076,330, filed on May 11, 1998, now U.S. Pat. No. 6,209,069. The present application is also related to the following co-pending U.S. patent applications: (1) application Ser. No. 09/076,298, filed on May 11, 1998, entitled Flexible Block Protection Scheme for Flash Memory, now U.S. Pat. No. 6,154,819; and (2) application Ser. No. 09/078,094, filed on May 11, 1998, entitled A Method and Apparatus for Hardware Block Locking in a Nom-Volatile Memory, now U.S. Pat. No. 6,026,016. Application Ser. Nos. 09/076,330, 09/076,298, and 09/078,094 are assigned to the assignee of the present application.

FIELD OF THE INVENTION

The present invention relates generally to integrated circuit memory devices, and more specifically to lock protecting one or more memory blocks in a non-volatile memory array.

BACKGROUND OF THE INVENTION

Flash EPROM (erasable programmable read-only memory) devices have developed into a popular source of non-volatile, electrically erasable memory in a wide range of digital applications. Flash memory devices typically use a one-transistor memory cell which allows for high memory densities, high reliability, and low power consumption. These characteristics have made flash memory very popular for low power applications, such as battery-backed or embedded memory circuits. Common uses of non-volatile memory include portable computers, personal digital assistant (PDA) devices, digital cameras, and cellular telephones. In these devices, both program code and system data, such as configuration parameters and other firmware, are often stored in flash memory because of the compact storage and relative ease of software upgradeability. The use of flash memory to store upgradeable data has necessitated the development of mechanisms to protect the data from unintended erasure or reprogramming.

With original flash memory devices, erasing stored code or data required erasing the entire device. Newer devices, however, are based on a block-erase architecture in which the flash memory is divided into blocks that are loosely analogous to the disk sectors recognized by disk operating systems. This block based architecture allows file systems to erase blocks of flash memory instead of the whole device. The block architecture also allows users to flexibly erase different portions of code or data in a flash device. For example, critical system code, such as boot code, can be stored in a lockable "boot block" of the device, while other blocks are allocated to other portions of code or data.

To ensure the integrity of block-based flash memory, block protection schemes are needed to protect stored data when the memory is modified through program or erase operations. Memory blocks must be protected against unintended writes when data is written to the device or when a new code segment is updated. Likewise, data blocks must be protected when other data blocks are modified or when code updates occur.

One present method of block protection for flash memory includes protecting a pre-determined number of blocks through a lock/unlock hardware pin. This requires the user to determine which blocks of memory are hardware protectable and reserve those blocks for critical data or program code. This approach is highly inflexible in that the user can only protect code or data in these predetermined hardware protectable blocks.

A second present method of block protection for flash memory includes the use of a block locking configuration table that is stored in the flash memory device itself. Typically the configuration is stored in a flash mini-array that is separate from the main flash memory array. Each bit in the configuration table represents a block that can be either locked or unlocked. This approach, however, has several disadvantages. One disadvantage is the excessive latency incurred in locking or unlocking individual blocks of memory. For example, in a typical flash device, on the order of ten microseconds are required to program a lock bit and one second is required to erase a lock bit. In systems in which code is being executed on the order of thousands of megahertz, these long cycle times required to protect memory blocks can create periods of vulnerability in which data corruption may occur.

Another disadvantage to this method is that, because the table is implemented in a dedicated flash mini-array, in which individual bits represent the different lockable blocks, reprogramming a particular block typically requires erasing the entire set of bits in the table, instead of only the bit for that block. Thus, reconfiguring even a single block incurs the erase cycle times for each of the bits in the table and the associated vulnerability to data corruption of these bits during the relatively long erase times.

An additional disadvantage of the flash based configuration table is that it occupies valuable die space in the flash device and each bit in the table requires associated flash sense, and program and erase circuitry.

Therefore, present methods of block protecting flash memory present several significant disadvantages, including inflexibility of lock configuration, higher costs due to addition of a flash mini-array, and possible data corruption due to vulnerability resulting from long program and erase cycle times.

SUMMARY OF THE INVENTION

A circuit is disclosed for protecting memory blocks in a block-based flash EPROM device. A non-volatile memory array includes a number of blocks that are capable of being placed in a locked state or an unlocked state. A volatile lock register is coupled to each of the lockable blocks in the memory array. A logic gate is coupled to one input of the volatile lock register, and a block set/reset line is coupled to a second input of the volatile lock register. A block latch control line is coupled to one input of the logic gate, and a group latch control line is coupled to a second input of the logic gate.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A block protection control circuit for a flash memory array is described. In one embodiment of the present invention, a set of volatile memory lock registers sets each lockable block of the flash memory to a locked or unlocked state, and a two-cycle command specifies whether a single block or a group of multiple blocks is to be locked or unlocked.

It is an intended advantage of embodiments of the invention to provide a block protection controller for flash memory that allows a user to dynamically select which blocks of a flash array to lock or unlock. It is a further intended advantage of embodiments of the invention to provide a block control circuit that locks or unlocks blocks of flash memory at high speeds and minimizes the possibility of data corruption during block lock and unlock cycles.

Figure 1:
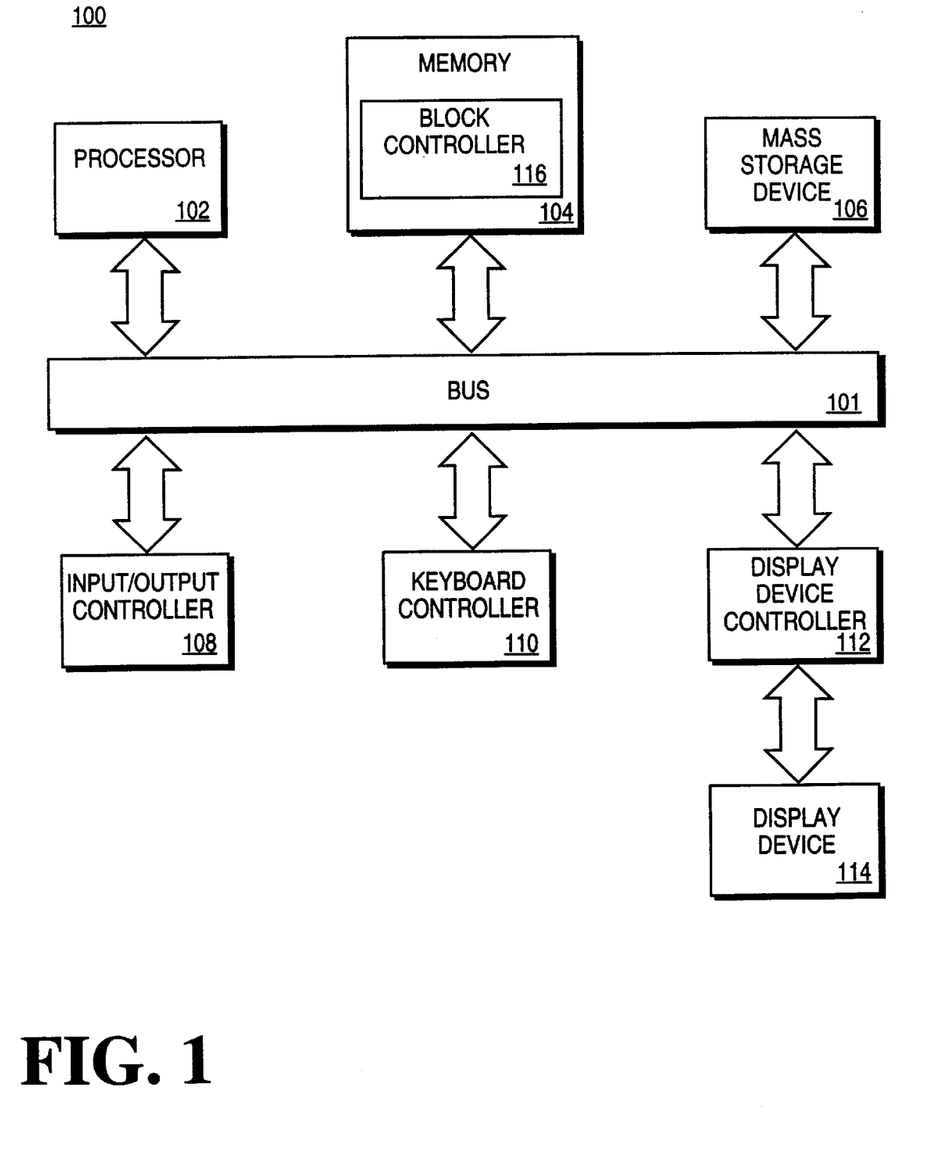
FIG. 1 is a block diagram of a computer system that includes a block controller coupled to a flash memory array according to an embodiment of the present invention.

FIG. 1 illustrates a block diagram of a computer system that incorporates a block controller coupled to flash memory array according to embodiments of the present invention. The computer system 100 includes a processor 102 coupled through a bus 101 to a memory 104 and a mass storage device 106. In certain embodiments of the present invention, memory 104 is random access memory ("RAM"), read-only memory ("ROM"), or other non-volatile memory, such as flash memory; and mass storage device 106 is a large-capacity persistent storage device, such as a hard disk drive, compact disc read-only memory (CD-ROM) drive, or tape drive. A keyboard controller 110 is coupled to bus 101 for receiving commands or data entered through a keyboard, mouse, or similar input device. A display device controller 112 is also coupled to bus 101 for providing output through an appropriately coupled display device 114. Also coupled to bus 101 is an input/output controller 108 for interfacing processor 102 to other devices, such as network interface devices and the like.

In one embodiment of the present invention, memory 104 is a block-erase architecture type of flash EPROM memory. Memory 104 includes a block controller unit 116 that configures the blocks within memory 104 in either a locked or unlocked state. The composition and operation of embodiments of block controller unit 116 will be provided in greater detail in the discussion that follows.

It should be noted that the architecture of FIG. 1 is provided only for purposes of illustration, and that a computer system that implements embodiments of the present invention is not limited to this specific architecture. For example, flash memory is often prominently used in digital devices other than computer systems. Such devices, as exemplified by cellular telephones, pagers, digital cameras, and personal digital assistants, typically include a microprocessor or other processing unit, and a flash memory device that is used to store program code and system data.

Figure 2:
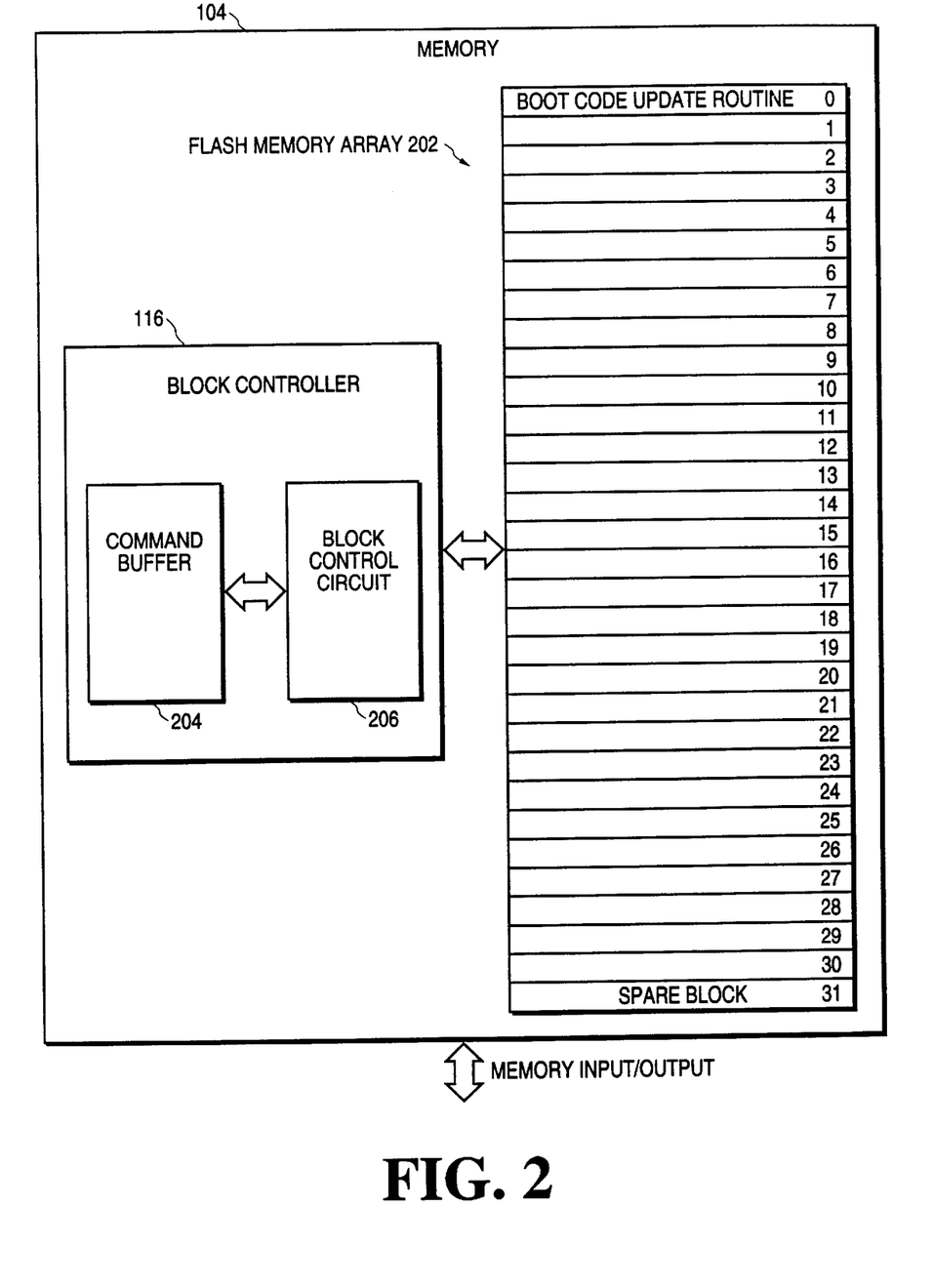
FIG. 2 is block diagram of a block controller coupled to a flash memory array, according to one embodiment of the present invention.

FIG. 2 is a block diagram that illustrates the interface between the block controller unit 116 and a flash memory array according to one embodiment of the present invention. Memory 104 includes a flash memory array 202 that is divided into a number of memory blocks. As illustrated in FIG. 2, flash memory array 202 includes 32 blocks numbered blocks 0 to 31. It is to be noted, however, that a flash memory device with any number of blocks may be used in conjunction with embodiments of the present invention. In a typical application, a specific block of the memory array may be a "boot block" that stores boot code for a computer or similar processing system, and one or more blocks, e.g., block 31, are reserved as spare blocks. Each of the remaining blocks is then available to store either additional program code or data. As illustrated in FIG. 2, the first block (block 0) is the boot block, however, the location of the boot block may vary among different computer systems, and depends on the memory address mapping scheme implemented in the actual computer system.

One or more of the blocks in flash memory array 202 is capable of being locked. A locked block is protected against program or erase operations. Flash memory array 202 is coupled to block controller unit 116 that controls the lock and unlock configuration of each of the lockable blocks in memory 104. Block controller unit 116 includes a command buffer 204 that receives read/write commands from the processor. Command buffer 204 is coupled to block control circuit 206. In one embodiment of the present invention, block control circuit 206 contains a number of digital registers, with each register controlling the lock status of a corresponding lockable block. In response to a particular lock or unlock command received from command buffer 204, block control circuit 206 generates the appropriate control signal to flash memory array 202 to configure the blocks accordingly. Block control circuit 206 also serves as a status register that is polled when the processor attempts to erase or write to a locked block. Block control circuit 206 can thus be configured to issue a status or error message in response to an invalid erase or write command.

Volatile Latch Block Lock Architecture

Figure 3:
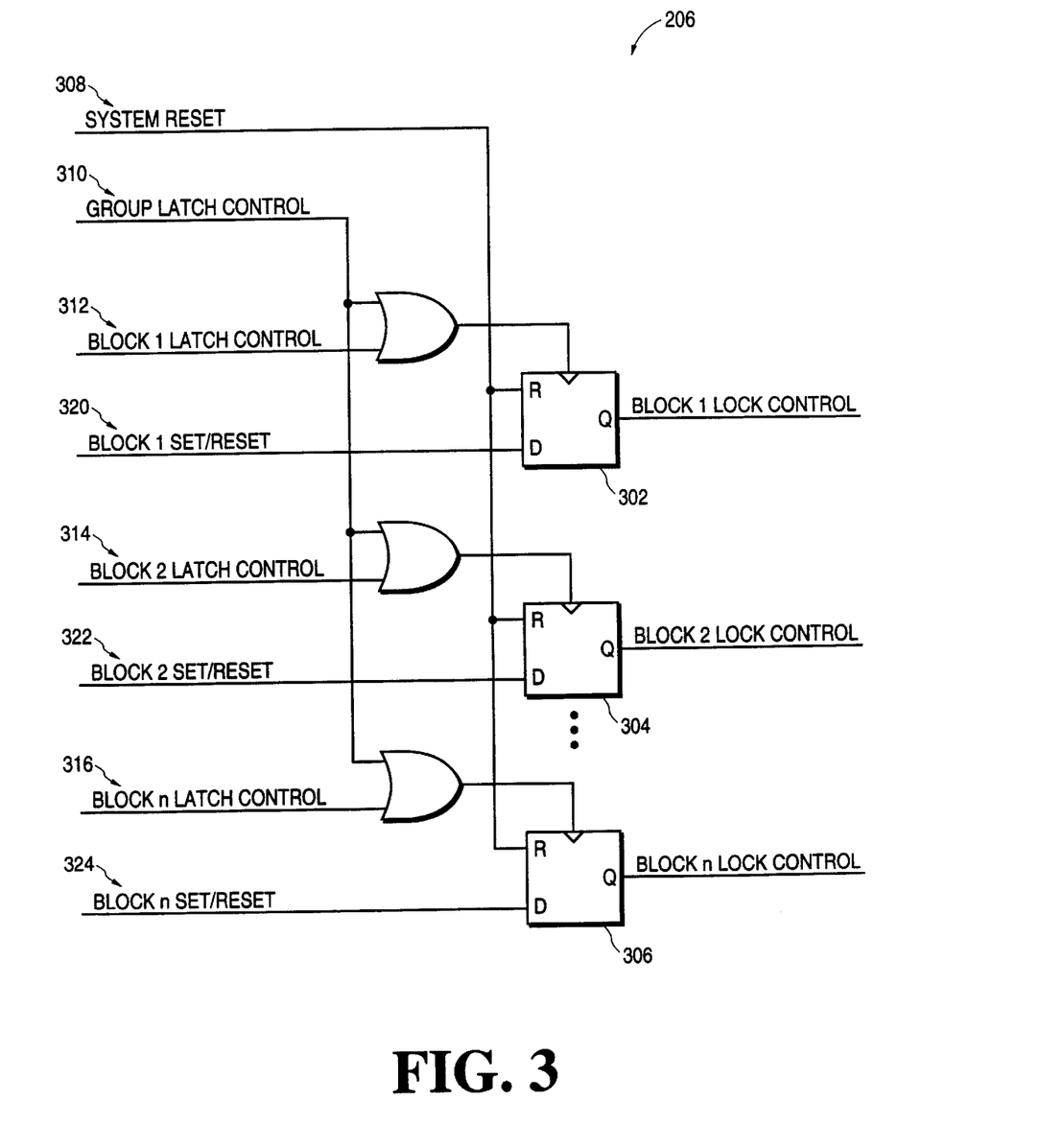
FIG. 3 is a circuit diagram of a block lock controller within the block controller of FIG. 2, according to one embodiment of the present invention.

FIG. 3 is a circuit diagram that illustrates in greater detail the internal structure of block control circuit 206, according to one embodiment of the present invention. The block control circuit 206 consists of a bank of latches or registers with one latch for each of the lockable blocks in flash memory array 202. Each of the latches or registers can be individually set or reset by a user using a standard command format. As illustrated in FIG. 3, the block control circuit 206 includes n D-type registers, 302 to 306, where n corresponds to the number of lockable blocks in the memory array coupled to circuit 206. For the example illustrated in FIG. 2, if each of the blocks in memory array 202 is capable of being locked, the for block control circuit 206, n=32. Although registers 302 to 306 in FIG. 3 are illustrated as D-type registers, block control circuit 206 may be implemented using other types of digital latch or register circuits.

The Q output of each register 302 to 306 generates a block lock control signal that is input, through logic circuits that control write operations to memory, to a corresponding block in memory array 202. Thus, the output from register 302 is denoted "block 1 lock control" signal, the output from register 304 is denoted "block 2 lock control" signal, and so on. The D inputs to the registers 302 to 306 are connected to block set/reset lines 320 to 324 that are driven by commands generated from command buffer 204. The logic state of a black set/reset signal connected to a register determines the state of the lock control signal transmitted to the corresponding block in the memory array. In one embodiment of the present invention, a logic high ("1") block set/reset level will cause the corresponding block to be locked. Conversely, a logic low ("0") block set/reset level will cause the corresponding block to be unlocked.

In one embodiment of the present invention, the clock inputs to the registers 302 to 306 are driven by latch control signals. The latch control signals are generated by a group latch control signal 310 that enables latching of all of the registers in a group, or by individual block latch control signals that enable only corresponding block control registers. In this manner, block set/reset commands must be synchronized with either a group latch control signal or individual block latch control signals 312 to 316 in order to lock or unlock the blocks in flash memory array 202. A system reset signal 308 is connected to the reset inputs of each of the registers 302 to 306 to allow a common reset of each of the block control registers upon the occurrence of a reset condition, such as a software reset or power-down condition.

In one embodiment of the present invention, the registers 302 to 306 comprising the block control circuit 206 in FIG. 3 are implemented in a volatile memory device, such as a static random access memory (SRAM) device. Typical SRAM devices feature much faster read/write cycle times than flash memory. Using volatile memory registers, thus allows much faster lock programming of flash memory blocks over present methods that use non-volatile memory tables to configure the lock configuration. For example, if such a configuration table is implemented in flash memory, a set or reset of the lock configuration may take up to one or two seconds (based on the erase cycles of typical flash cells). This update time represents a period of vulnerability in which the data may be corrupted by a spurious write operation. If the processor coupled to the memory is executing code on the order of millions of cycles per second, the possibility of a spurious write during the period of vulnerability is quite high. The use of volatile registers in embodiments of the present invention, thus minimizes this period of vulnerability by allowing reconfiguration of these volatile registers at cycle times approximating SRAM memory cycles or flash read times.

Lock Commands

In one embodiment of the present invention, two-cycle write commands are issued from command buffer 204 to lock or unlock blocks in flash memory array 202. The first cycle of the two-cycle command comprises a configuration command. The configuration command determines whether a particular block or group of blocks in the flash memory array is to be locked or unlocked. The second cycle of the two-cycle command comprises a command which specifies whether the configuration command of the first cycle applies to a single block or to a group of blocks in the flash memory array.

In the block control circuit of FIG. 3, each block of the flash array can be locked or unlocked using software commands that change the protection status of the block. The protection status can be set to one of the following two states, locked or unlocked. This protection status is specified in the configuration command transmitted in a first cycle of a two-cycle command.

Locked blocks are fully protected from alteration. Any program or erase operations attempted on a locked block will return an error to a status register. In one embodiment of the present invention, the status of a locked block can be changed to unlocked or lock-down using appropriate software commands. Unlocked blocks can be programmed or erased. The status of an unlocked block can be changed to a locked block using appropriate software commands.

Figure 4A:
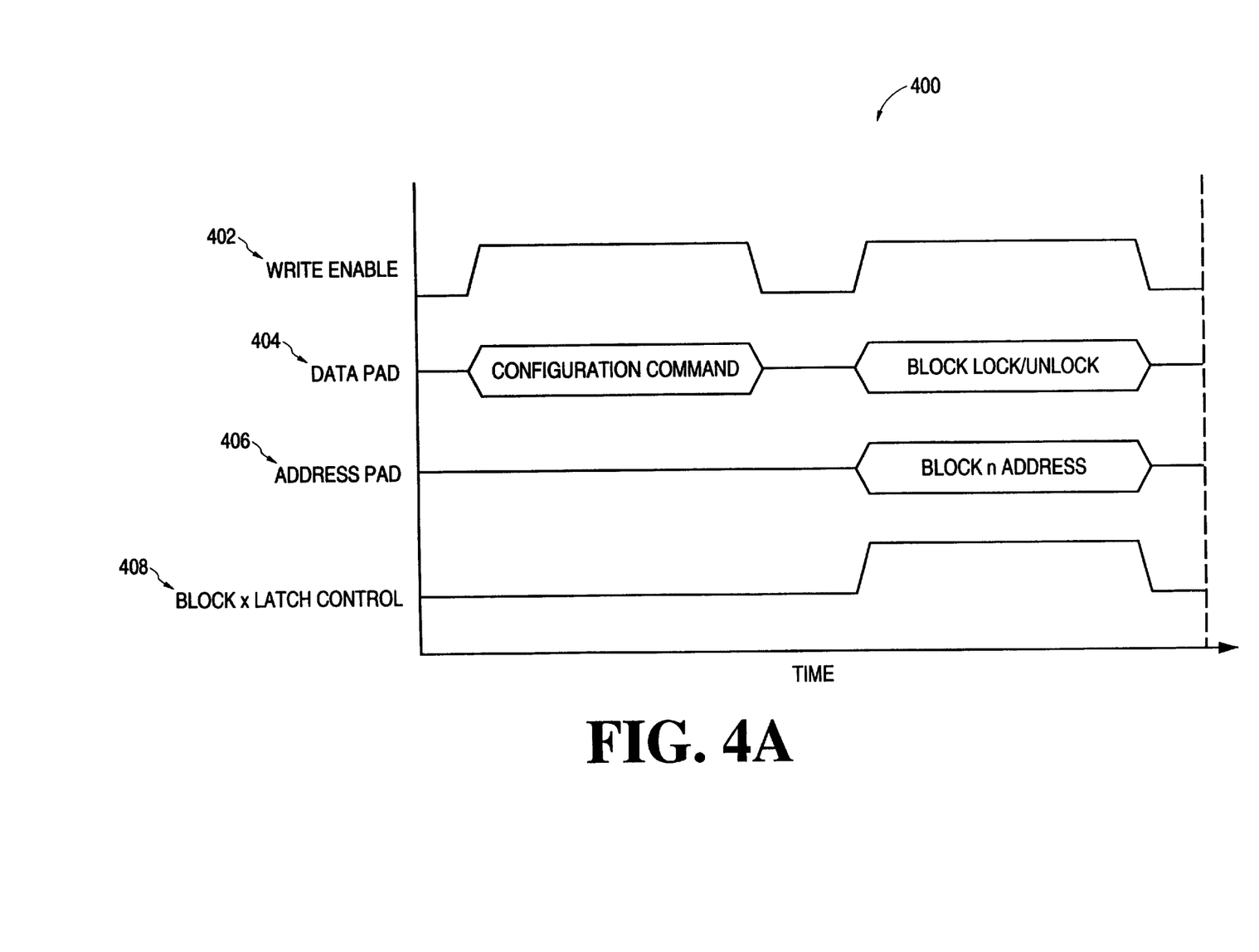
FIG. 4A is a timing diagram illustrating the sequence of execution of a single block lock/unlock command, according to one embodiment of the present invention.

FIG. 4A is a timing diagram 400 illustrating the sequence of execution of a single block lock/unlock command according to one embodiment of the present invention. The data line or pad 404 transmits the two-cycle command that specifies the block configuration and the type of command, i.e., single block. The two cycles of the command on the data line are valid during positive cycles of the write enable signal 402. For a single block command, the address line or pad 406 input to memory 104 is decoded to determine which lock bit in block control circuit 206 to set or reset. The configuration command takes effect on the block specified by the address upon a positive-going cycle of the block latch control signal 408. The lock bit in block control circuit 206 that is set or reset corresponds to the D-register that controls the particular block. In one embodiment of the present invention, the single block latch control line (e.g., 312, 314, or 316) to the register is enabled and the state of the block set/reset line (e.g., 320, 322, or 324) to the register is latched.

Thus, in FIG. 4A, a block is configured by first determining the lock configuration of the block, establishing that the command is a single block command, determining the specific block to be configured by decoding the address, and unlocking or locking the block through the block latch control signal.

Figure 4B:
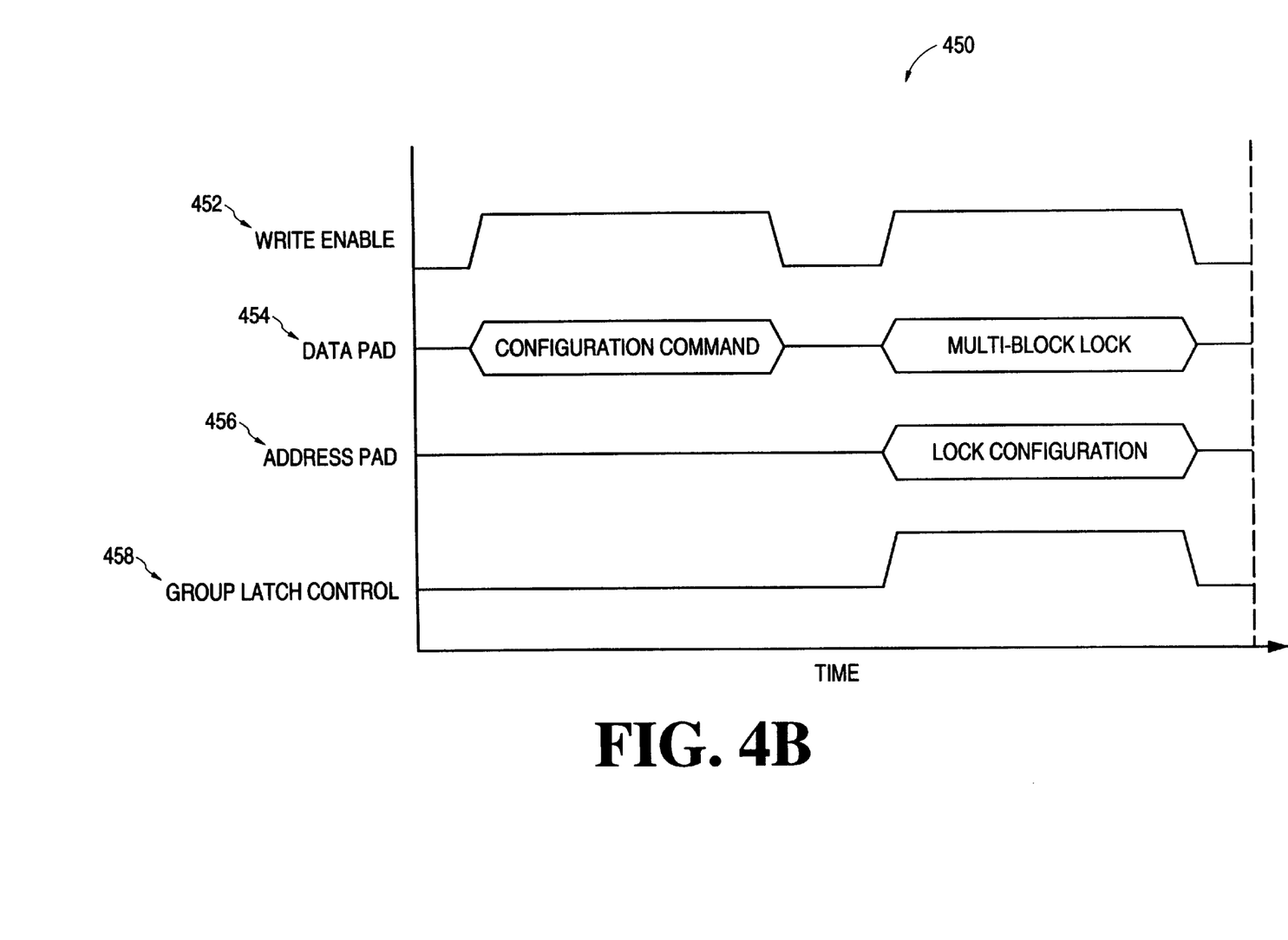
FIG. 4B is a timing diagram illustrating the sequence of execution of a multi-block lock/unlock command, according to one embodiment of the present invention.

FIG. 4B is a timing diagram 450 illustrating the sequence of execution of a multi-block lock/unlock command according to one embodiment of the present invention. The data line 454 transmits the two-cycle command that specifies the block configuration and the type of command, i.e., multi-block. The two cycles of the command on the data line are valid during positive cycles of the write enable signal 452. In the multi-block lock command, each bit of the address encoded in the address signal 456 corresponds to an individual block in the memory array. Each block is locked or unlocked depending on whether the corresponding bit is set or reset. The lock bits in block control circuit 206 that are set or reset correspond to the D-registers that control those particular blocks. In one embodiment of the present invention, the group latch control line (e.g., 310 in FIG. 3) to the registers to be set is enabled and the state of the block set/reset line (e.g., 320, 322, or 324) to the appropriate registers are latched.

Thus, in FIG. 4B, a group of blocks is configured by first determining the lock configuration of the blocks, establishing that the command is a multi-block command, determining the specific blocks to be configured by decoding the address, and unlocking or locking the blocks through the group latch control signal.

For the multi-block method illustrated in FIG. 4B, in one embodiment of the present invention, if there are more blocks in the array than address pads, block control circuit 206 is configured such that each bit is configured to control multiple blocks. In an alternative embodiment of the present invention, if there are more blocks in the array than address pads, multiple configuration commands could be defined to allow individual block control. The configuration command takes effect on the block specified by the address upon a positive-going cycle of the group latch control signal 458.

In FIGS. 4A and 4B, the write commands to lock or unlock blocks in flash memory array 202, were illustrated as two-cycle commands. In an alternative embodiment of the present invention, single cycle commands are used. Single-cycle commands specify both the identity of the block to be configured, and its locked or unlocked configuration. Similarly, in further alternative embodiments of the present invention, multi-cycle commands (consisting of three or more cycles) are used to configure the flash blocks to locked or unlocked states.

Figure 5:
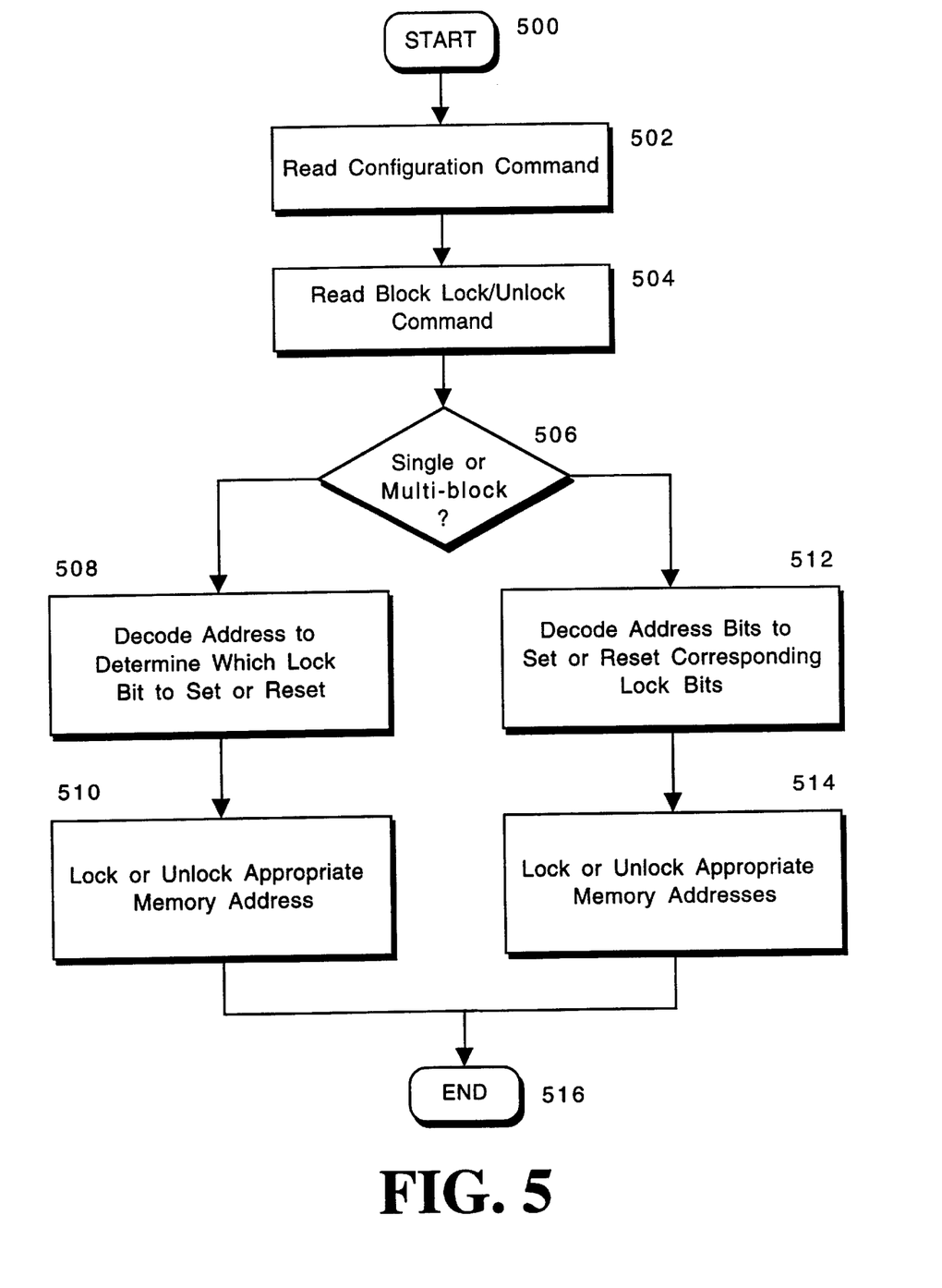
FIG. 5 is a flowchart illustrating the locking or unlocking of single or multiple blocks in a flash array, according to one embodiment of the present invention.

FIG. 5 is a flowchart illustrating the locking or unlocking of single or multiple blocks in a flash array, according to one embodiment of the present invention. The process starts in step 500. In step 502, the configuration command is read by the block control circuit. In one embodiment of the present invention, the configuration command is encoded in the first cycle command of a two-cycle command. The configuration command specifies whether the block or blocks being addressed are to be locked or unlocked. In step 504, the block lock/unlock command is read by the block control circuit. In one embodiment of the present invention, the block lock/unlock command is encoded in the second cycle command of a two-cycle command. The block lock/unlock command specifies whether the lock or unlock configuration command specified in step 502 is a single-block command or a multi-block command.

If, in step 506, it is determined the configuration command is a single-block command, the address on the address pad is decoded to determine which lock bit in the block control circuit to set or reset, step 508. The appropriate memory address is then locked or unlocked depending on the configuration command, step 510. At this point the process ends at step 516.

If, in step 506, it is determined the configuration command is a multiple-block command, each bit of the address on the address pad corresponds to an individual block. These address are decoded to determine lock bits in the block control circuit to set or reset, step 512. The appropriate memory addresses are then locked or unlocked depending on the configuration command, step 514. At this point the process ends at step 516.

Embodiments of the present invention, as exemplified by FIGS. 3 and 5, are used in applications requiring secure storage of sensitive or vulnerable data or code. The use of volatile lock registers as described herein allows real-time data protection by minimizing the lock and unlock cycle times, and hence the period of vulnerability of the non-volatile memory to data corruption during these cycle times. The use of two-cycle commands that specify that a single block or a group of blocks is to be configured allows for fast and flexible lock configuration of different memory blocks in a flash memory array.

In the foregoing, a circuit has been described for flexibly locking individual or multiple blocks in a flash memory array. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A computing system comprising:
   a processor;
   a non-volatile memory device coupled to the processor, the non-volatile memory device having a memory array including a plurality of blocks; and
   a block controller to place one or more blocks of the plurality of blocks of the non-volatile memory device in a locked or an unlocked state, the block controller comprising:
   a volatile lock register coupled to a block of the one or more blocks;
   a logic gate having an output coupled to a first input of the volatile lock register;
   a block set/reset line coupled to a second input of the volatile lock register;
   a block latch control line coupled to a first input of the logic gate; and
   a group latch control line coupled to a second input of the logic gate.

2. The computing system of claim 1, wherein the memory array includes a flash memory array and the lock volatile register is embodied in a static random access memory circuit.

3. The computing system of claim 2, wherein the logic gate includes an OR-type logic gate.

4. The computing system of claim 3, wherein the volatile lock register is set to a first state or a second state depending on a logic state of a signal transmitted on the block set/reset line, and wherein the volatile lock register transmits a lock control signal to the block of the one or more blocks.

5. The computing system of claim 4, wherein the volatile lock register being set to the first state causes the block of the one or more blocks to be locked to a protected state from write or erase operations, and the volatile lock register being set to the second state causes the block of the one or more blocks to be unblocked to allow modification by write or erase operations.

6. The computing system of claim 5, wherein the first input to the volatile lock register is a clock input.

7. A computing system comprising:
   a processor;
   a non-volatile memory device coupled to the processor, the non-volatile memory device having a memory array including a plurality of blocks; and
   a block controller to place one or more blocks of the plurality of blocks of the non-volatile memory device in a locked state or an unlocked state, the block controller including:
   a set of volatile lock registers, each volatile lock register of the set of volatile lock registers coupled to a corresponding block of the one or more blocks, and operable to prevent corresponding blocks from being modified;
   a block set/reset line coupled to a first input of each lock register of the volatile lock registers; and
   a block latch control line and a group latch control line coupled through combinatorial logic to a second input of each lock register of the volatile lock registers.

8. The computing system of claim 7, further comprising:
   a command buffer coupled to the set of volatile lock registers, the command buffer operable to transmit a two-cycle command to each register of the set of volatile lock registers, wherein the first cycle comprises a first cycle command specifying whether a lock configuration of the memory array is to be changed, and the second cycle comprises a second cycle command specifying whether said first cycle command applies to a single block of the memory array or to multiple blocks of the memory array.

9. The computing system of claim 8, wherein if the first cycle command is a first command type, a block of the memory array is to be locked, and if said first cycle command is a second command type, a block of the memory array is to be unlocked.

10. The computing system of claim 9, wherein if the second cycle command applies to a single block, an address input on an address bus coupled to the computing system is decoded to set or reset one register of the set of lock registers.

11. The computing system of claim 10, wherein if the second cycle command applies to multiple blocks, an address input on an address bus coupled to the apparatus is decoded to set or reset two or more lock registers of the set of lock registers, each bit of said address corresponding to a lock register of the two or more lock registers.

12. The computing system of claim 11, wherein the memory array is a flash memory and the set of lock registers is embodied is static random access memory circuits.

* * * * *

UNITED STATES PATENT AND TRADEMARK OFFICE
CERTIFICATE OF CORRECTION

PATENT NO.     : 6,446,179 B2
DATED          : September 3, 2002
INVENTOR(S)    : Baltar It is certified that error appears in the above-identified patent and that said Letters Patent is hereby corrected as shown below:

<u>Column 4,</u>
Line 59, delete "the", insert -- then --.

<u>Column 5,</u>
Line 5, delete "black", insert -- block --.

Signed and Sealed this

Eighteenth Day of February, 2003

JAMES E. ROGAN
*Director of the United States Patent and Trademark Office*